United States Patent
Wu et al.

(10) Patent No.: US 9,655,272 B2
(45) Date of Patent: May 16, 2017

(54) CONNECTING CIRCUIT FOR SERVER BACK PANEL

(71) Applicant: ScienBiziP Consulting (Shen Zhen) Co., Ltd., Shenzhen (CN)

(72) Inventors: Kang Wu, Shenzhen (CN); Guo-Yi Chen, Shenzhen (CN)

(73) Assignee: ScienBiziP Consulting (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 14/815,370

(22) Filed: Jul. 31, 2015

(65) Prior Publication Data

US 2017/0020020 A1    Jan. 19, 2017

(30) Foreign Application Priority Data

Jul. 16, 2015   (CN) .......................... 2015 1 0417765

(51) Int. Cl.
*H05K 7/20*     (2006.01)
*H05K 7/14*     (2006.01)

(52) U.S. Cl.
CPC ......... *H05K 7/1459* (2013.01); *H05K 7/1439* (2013.01)

(58) Field of Classification Search
CPC .................................................... H05K 7/1459
USPC ................................................. 361/791, 788
See application file for complete search history.

(56) References Cited

U.S. PATENT DOCUMENTS

| | | | | |
|---|---|---|---|---|
| 5,530,895 A * | 6/1996 | Enstrom | ............... | G06F 9/4411 710/104 |
| 5,958,030 A * | 9/1999 | Kwa | ................... | G06F 11/2733 361/600 |
| 6,438,625 B1 * | 8/2002 | Olson | ................... | G06F 13/409 361/788 |
| 6,564,278 B1 * | 5/2003 | Olson | ................... | G06F 13/409 710/300 |
| 7,321,313 B1 * | 1/2008 | Inlow | ................... | H01R 13/641 340/654 |
| 8,737,067 B1 * | 5/2014 | Kim | ..................... | H05K 7/1492 342/175 |

* cited by examiner

*Primary Examiner* — Dion R Ferguson
*Assistant Examiner* — Mandeep S Buttar
(74) *Attorney, Agent, or Firm* — Steven Reiss

(57) ABSTRACT

A connecting circuit includes a motherboard, a first back panel, and a second back panel. The motherboard defines a first connector and a second connector. The first connector includes a first address distinguishing pin. The second connector includes a second address distinguishing pin. The first back panel is coupled with the first connector and transmits a first address signal to the first connector. The second back panel is coupled with the second connector and transmits a second address signal to the second connector. The first address distinguishing pin is connected to ground and the second address distinguishing pin is connected to a high level voltage to distinguish the first address signal from the second address signal.

11 Claims, 2 Drawing Sheets

CONNECTING CIRCUIT FOR SERVER BACK PANEL

CROSS-REFERENCE TO RELATED APPLICATION

This application claims priority to Chinese Patent Application No. 201510417765.X filed on Jul. 16, 2015, the contents of which are incorporated by reference herein.

FIELD

The subject matter herein generally relates to connecting circuits, and particularly to a connecting circuit for server back panels.

BACKGROUND

As the development of computing and network technology, different servers are used to satisfy different requirements. For expanding the using of the server, one or two back panels are connected to a motherboard of the server. However, when there are two same back panels are connected to the motherboard, a bus control unit often can not distinguish the two back panels with each other which causes troubles in signal transmission between the back panels and the motherboard.

BRIEF DESCRIPTION OF THE DRAWINGS

Implementations of the present technology will now be described, by way of example only, with reference to the attached figures.

DETAILED DESCRIPTION

Figure 1:
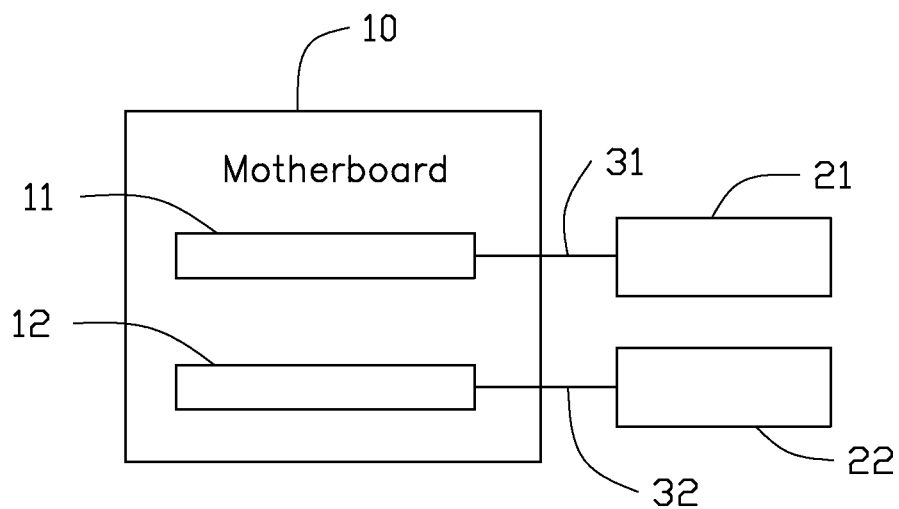
FIG. 1 is a block diagram of one embodiment of a connecting circuit for server back panels.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

FIG. 1 illustrates one embodiment of a connecting circuit for server back panels. The connecting circuit is used to connecting two back panels to a motherboard 10. The two back panels are a first back panel 21 and a second back panel 22. The first back panel 21 and the second back panel 22 are two same back panels. The motherboard 10 includes a first connector 11 and a second connector 12. A first cable 31 is used to connect the first back panel 21 to the first connector 11. A second cable 32 is used to connect the second back panel 22 to the second connector 12.

Figure 2:
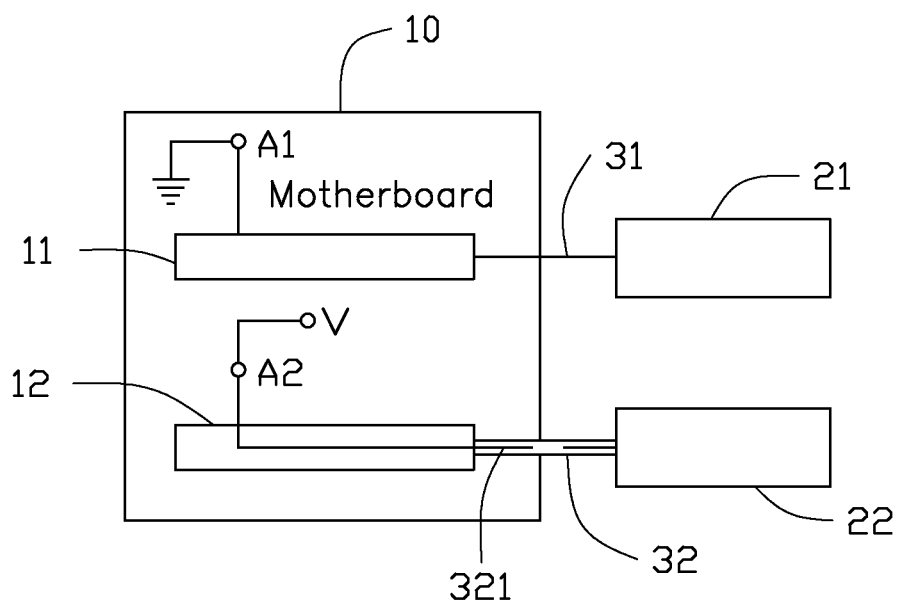
FIG. 2 is a block diagram of one embodiment of a connecting circuit for server back panels.

Referring to FIG. 2, each of the first connector 11 and the second connector 12 includes a plurality of address pins (not shown). The address pins of the first connector 11 receive a first address signal (such as 11000 . . . 1) from the first back panel 21 via the first cable 31. The address pins of the second connector 12 receive a second address signal (such as 11000 . . . 1) from the second back panel 22 via the second cable 32. The address pins of the first connector 11 includes a first address distinguishing pin A1. The address pins of the second connector 12 includes a second address distinguishing pin A2. The first address distinguishing pin A1 is connected to ground. The second address distinguishing pin A2 is connected to a high level voltage V. The second cable 32 includes a signal wire 321 which is connected to the second address distinguishing pin A2. The signal wire 321 is cut off. A position of the first address distinguishing pin A1 in the address pins of the first connector 11 is same as that of the second address distinguishing pin A2 in the address pins of the second connector 12. For example, the first address distinguishing pin A1 is in the first position or last position of the address pins of the first connector 11, and the second address distinguishing pin A2 is in the first position or last position of the address pins of the second connector 12.

The first back panel 21 is connected to the first connector 11 via the first cable 31. The second back panel 22 is connected to the second connector 12 via the second cable 32. The first address signal of the first back panel 21 is transmitted to the address pins of the first connector 11. Because the first address distinguishing pin A1 is connected to ground, a signal on the first address distinguishing pin A1 is "0". The second address signal of the second back panel 22 is transmitted to the address pins of the second connector 12. Because the second address distinguishing pin A2 is connected to the high level voltage V, and the signal wire 321 which is connected to the second address distinguishing pin A2 is cut off, a signal on the second address distinguishing pin A2 is "1".

The position of the first address distinguishing pin A1 in the address pins of the first connector 11 is same as that of the second address distinguishing pin A2 in the address pins of the second connector 12. A bus control unit of the motherboard 10 can distinguish the address of the first connector 11 from the address of the second connector 12 by the difference of the signals on the first address distinguishing pin A1 and the second address distinguishing pin A2. For example, in event the first address distinguishing pin A1 is in the first position of the address pins of the first connector 11, and the second address distinguishing pin A2 is in the first position or last position of the address pins of the second connector 12, the bus control unit can identify the address of the first connector 11 when the first position of the address signal is "0" and identify the address of the second connector 12 when the second position of the address signal is "1".

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to, and including, the full extent established by the broad general meaning of the terms used in the claims. It will therefore be appreciated that the embodiments described above may be modified within the scope of the claims.

What is claimed is:

1. A connecting circuit for two server back panels, the connecting circuit comprising:
   a motherboard defining a first connector and a second connector, the first connector comprising a first address distinguishing pin, the second connector comprising a second address distinguishing pin;
   a first back panel coupled with the first connector and transmitting a first address signal to the first connector; and
   a second back panel coupled with the second connector via a second cable and transmitting a second address signal to the second connector;
   wherein the first address distinguishing pin is connected to ground and the second address distinguishing pin is connected to a high level voltage to distinguish the first address signal from the second address signal;
   wherein the second cable comprises a signal wire which is connected to the second address distinguishing pin, and the signal wire is electronically cut off.

2. The connecting circuit of claim 1, wherein a position of the first address distinguishing pin in address pins of the first connector is same as that of the second address distinguishing pin in address pins of the second connector.

3. The connecting circuit of claim 2, wherein the first address distinguishing pin is in the first position of the address pins of the first connector, and the second address distinguishing pin is in the first position of the address pins of the second connector.

4. The connecting circuit of claim 2, wherein the first address distinguishing pin is in the last position of the address pins of the first connector, and the second address distinguishing pin is in the last position of the address pins of the second connector.

5. The connecting circuit of claim 1, wherein first back panel is connected to the first connector via a first cable.

6. The connecting circuit of claim 1, wherein the first back panel and the second back panel are two same back panels.

7. A connecting circuit comprising:
   a motherboard defining a first connector and a second connector, the first connector comprising a first address distinguishing pin, the second connector comprising a second address distinguishing pin, a position of the first address distinguishing pin in address pins of the first connector is same as that of the second address distinguishing pin in address pins of the second connector;
   a first back panel coupled with the first connector and transmitting a first address signal to the first connector; and
   a second back panel coupled with the second connector via a second cable and transmitting a second address signal to the second connector;
   wherein the first address distinguishing pin is connected to ground and the second address distinguishing pin is connected to a high level voltage to distinguish the first address signal from the second address signal;
   wherein the second cable comprises a signal wire which is connected to the second address distinguishing pin, and the signal wire is electronically cut off.

8. The connecting circuit of claim 7, wherein the first address distinguishing pin is in the first position of the address pins of the first connector, and the second address distinguishing pin is in the first position of the address pins of the second connector.

9. The connecting circuit of claim 7, wherein the first address distinguishing pin is in the last position of the address pins of the first connector, and the second address distinguishing pin is in the last position of the address pins of the second connector.

10. The connecting circuit of claim 7, wherein first back panel is connected to the first connector via a first cable.

11. The connecting circuit of claim 7, wherein the first back panel and the second back panel are two same back panels.

* * * * *